United States Patent [19]
Miyatsuji et al.

[11] Patent Number: 5,903,178
[45] Date of Patent: May 11, 1999

[54] SEMICONDUCTOR INTEGRATED CIRCUIT

[75] Inventors: Kazuo Miyatsuji; Daisuke Ueda, both of Osaka, Japan

[73] Assignee: Matsushita Electronics Corporation, Osaka, Japan

[21] Appl. No.: 08/948,033

[22] Filed: Oct. 9, 1997

Related U.S. Application Data

[63] Continuation of application No. 08/573,060, Dec. 15, 1995, abandoned.

[30] Foreign Application Priority Data

Dec. 16, 1994 [JP] Japan .................................. 6-312880

[51] Int. Cl.$^6$ ..................................................... H01P 1/22
[52] U.S. Cl. ......................................... 327/308; 333/81 R
[58] Field of Search .................................. 327/305, 308, 327/389, 391, 419, 427, 431, 434, 435, 436, 437; 333/81 R

[56] References Cited

U.S. PATENT DOCUMENTS

| | | | |
|---|---|---|---|
| 4,787,686 | 11/1988 | Tajima et al. ......................... | 331/81 R |
| 4,890,077 | 12/1989 | Sun ........................................... | 333/81 |
| 4,975,604 | 12/1990 | Barta ...................................... | 333/81 R |
| 4,988,902 | 1/1991 | Dingwall ................................ | 327/382 |
| 5,072,142 | 12/1991 | Tanino .................................... | 327/427 |
| 5,309,048 | 5/1994 | Khabbaz ................................ | 327/382 |
| 5,350,957 | 9/1994 | Cooper et al. ......................... | 327/437 |
| 5,461,265 | 10/1995 | Kunishisa et al. .................... | 327/379 |
| 5,517,150 | 5/1996 | Okumura ............................... | 327/427 |

FOREIGN PATENT DOCUMENTS

| | | | |
|---|---|---|---|
| 54127658 | 10/1979 | Japan ..................................... | 333/81 R |
| 514120 | 1/1993 | Japan ..................................... | 333/81 R |
| 7-066705 | 3/1995 | Japan . | |

*Primary Examiner*—Tuan T. Lam
*Attorney, Agent, or Firm*—McDermott, Will & Emery

[57] ABSTRACT

A drain and a source of a field-effect transistor are connected to first and second signal terminals, respectively. A first control terminal is connected to a gate. A first resistor is interposed between the gate and the first control terminal. Capacitors are interposed between the source/drain and the first and second signal terminals, respectively. A control terminal is connected to at least one of the source/drain via a second resistor. High frequency signals supplied through the first signal terminal is sent through the field-effect transistor and outputted through the second signal terminal, and a quantity of the transmitted high frequency signals is controlled by a control voltage signal applied across the first and second control terminals. This structure provides a high frequency semiconductor integrated circuits which reduces a power consumption and an occupied area, increases a switchable power, suppresses output distortion, and simplifies a peripheral circuit.

7 Claims, 9 Drawing Sheets

8···FIRST BASIC CIRCUIT
9···SECOND BASIC CIRCUIT
10···INPUT TERMINAL
11···OUTPUT TERMINAL
12···THIRD CONTROL TERMINAL
13···POWER SUPPLY TERMINAL
20···UNIT CIRCUIT

Fig.1

1···FIELD EFFECT TRANSISTOR
2a, 2b···RESISTOR
3···FIRST CONTROL TERMINAL
4···SECOND CONTROL TERMINAL
5a, 5b···CAPACITOR
6···FIRST SIGNAL TERMINAL
7···SECOND SIGNAL TERMINAL

8···FIRST BASIC CIRCUIT
9···SECOND BASIC CIRCUIT
10···INPUT TERMINAL
11···OUTPUT TERMINAL
12···THIRD CONTROL TERMINAL
13···POWER SUPPLY TERMINAL
20···UNIT CIRCUIT

Fig. 9
PRIOR ART directly in a basic circuit transmitting the high frequency signals or in a basic circuit connected to the ground. Since the first and second control terminals receive the control voltage signal, the control system for the control voltage signal can be unitary. Consequently, a peripheral circuit such as a driving circuit for the control signal can be simplified.

SEMICONDUCTOR INTEGRATED CIRCUIT

This is a file wrapper continuation application of application Ser. No. 08/573,060 filed Dec. 15, 1995, now abandoned.

BACKGROUND OF THE INVENTION

The present invention relates to a high frequency semiconductor integrated circuit which is used in mobile communication equipment such as a portable telephone.

Owing to recent advancement of the mobile communication technologies, there have been demands for high frequency semiconductor switches and high frequency semiconductor variable attenuators, which are small in size and require a low power consumption. These switches and attenuators are used for switching a communication mode (transmission and receipt mode) of an antenna of a portable telephone or the like and controlling an input level of a power amplifier. As a device used in such switches and attenuators, there has been used a basic circuit shown in FIG. 8 which includes a field-effect transistor (FET).

Figure 8:
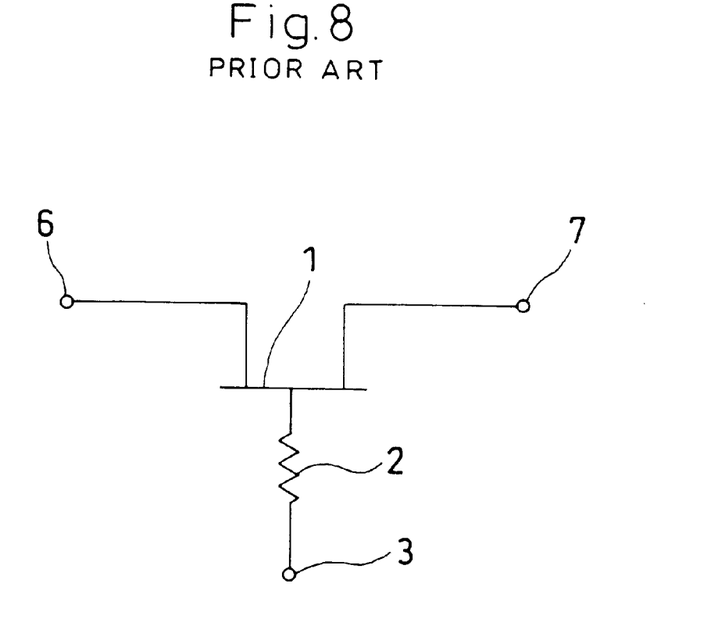
FIG. 8 is a circuit diagram showing a structure of a basic circuit in a high frequency semiconductor integrated circuit in the prior art.

In FIG. 8, a reference number "1" indicates a normally-on field-effect transistor, which is formed at a portion of a Ga-As substrate (not shown) and includes a gate, a source and a drain. A reference number "3" indicates a control terminal. Reference numbers "6" and "7" indicate first and second signal terminals, respectively. In this structure, a control voltage signal is applied to the gate of the field-effect transistor 1 via the control terminal 3 and the value of the voltage control signal is changed, whereby a quantity of high frequency signals transmitted between the first and second signal terminals 6 and 7 are controlled.

Figure 9:
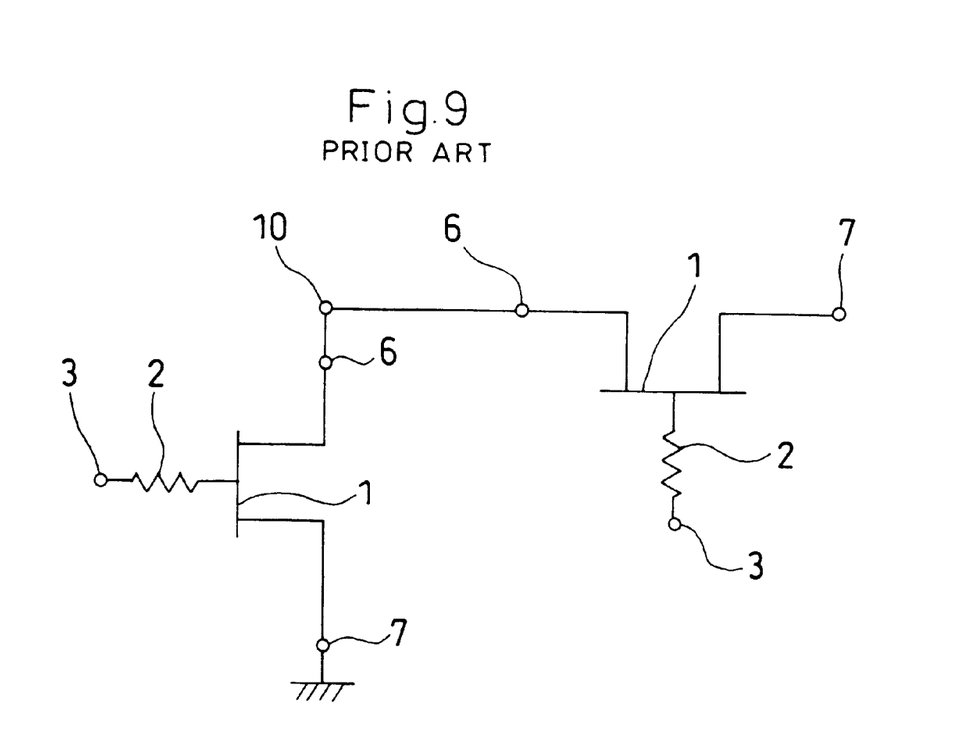
FIG. 9 is a circuit diagram showing a structure of a switch circuit formed of combination of basic circuits in a high frequency semiconductor integrated circuit in the prior art.

FIG. 9 shows a circuit structure including two basic circuits, each of which is the same as that shown in FIG. 8. In each of the basic circuits, the first signal terminal 6 is connected to a common input terminal 10. In one of the basic circuits, the second signal terminal 7 is used as an output terminal. In the other basic circuit, the second signal terminal 7 is connected to a ground terminal. In this circuit, complementary control signals are supplied to the control terminals 3 of the respective basic circuits so that the quantities of signals transmitted in respective basic circuits are controlled complementarily. Thus, when the field-effect transistor is off in the basic circuit transmitting high frequency signals to the output terminal, high frequency signals are sent to the ground terminal, so that significantly excellent isolation can be achieved.

However, the circuit shown in FIG. 9 including combination of the conventional basic circuits suffers from the following problems.

As already describe with reference to FIG. 9, a high frequency control circuit such as a switch includes a basic circuit shown in FIG. 8 as a unit, and also includes another basic circuit interposed between the input and the output, between the input and the ground, or between the output and the ground of the former basic circuit. This structure requires two control terminal systems for receiving complementary control voltage signals. The circuit shown in FIG. 9, for example, requires two control circuits for supplying complementary control voltage signals to the respective control terminals 3 of the basic circuits. Thus, two control terminals are essentially required, and further a complicated structure is required in a peripheral circuit for driving the high frequency control circuit. A similar problem also arises in a bridge T-type attenuator including combination of unit circuits, each of which is the same as that shown in FIG. 8, because it requires two control systems for inputting two complementary control signals, although this is not discussed.

Furthermore, such a problem may arise that linearity characteristics between the input and the output deteriorates, and thus distortion in the output is increased, when a high frequency signal of a high power is inputted. Therefore, when the basic circuit shown in FIGS. 8 and/or those shown in FIG. 9 are used in combination as a switch or an attenuator, only a restricted power can be applied.

SUMMARY OF THE INVENTION

The invention has been developed in view of the above problems. The first object of the invention is to improve the structure of a basic circuit required in switches and attenuators and thereby provide a semiconductor integrated circuit for high frequency control, in which a structure of a peripheral circuit such as a driving circuit can be simplified.

The second objective of the present invention is to reduce distortion between the input and the output in a semiconductor integrated circuit for high frequency control, which has the above simplified structure.

In order to accomplish the first objective, a first semiconductor integrated circuit according to the invention includes means for preventing transmission of a DC signal between first and second signal terminals of a basic circuit and source/drain of a field-effect transistor, wherein the field-effect transistor is controlled with a voltage across a gate and the source/drain of the field-effect transistor.

In order to accomplish the second objective, a second semiconductor integrated circuit of the invention includes a field-effect transistor in a basic circuit having a plurality of gates.

More specifically, the invention provides a first semiconductor integrated circuit having a basic circuit for transmitting high frequency signals, wherein the basic circuit includes: a field-effect transistor having a gate, a source, and a drain; first and second signal terminals for externally transmitting high frequency signals to and from the field-effect transistor; DC component intercepting members interposed at lines between the source/drain of the field-effect transistor and the first and second signal terminals, and containing at least a capacitor component having an impedance lower than a line impedance in a frequency band to be used; a first control terminal connected to the gate; a first preventing member interposed between the gate and the first control terminal, having resistance characteristics of an impedance higher than the line impedance, and provided for preventing input of a high frequency signal to the first control terminal; a second control terminal connected via a branched line to a line between the DC component intercepting member and at least one of the source/drain of the field-effect transistor; and a second preventing member arranged at the branched line, having resistance characteristics of an impedance higher than the line impedance, and provided for preventing input of a high frequency signal to the second control terminal. A quantity of high frequency signals transmitted between the first and second signal terminals of the basic circuit is controlled with a control voltage signal applied between the first and second control terminals.

According to the above structure, when a high frequency signal is supplied to the first or second signal terminal, the quantity of transmitted high frequency signals is controlled with the control voltage signal applied between the gate and the source/drain of the field-effect transistor interposed between the first and second signal terminals. Since the first and second control terminals are independently connected to the gate and the source/drain, respectively, a structure including a plurality of basic circuits can have such a connection form that the first control terminal in one of the basic circuits and the second control terminal in another basic circuit are commonly connected. Since the DC component intercepting members containing the capacitor component are interposed between the source/drain of the field-effect transistor and the first and second signal terminal, potentials at the respective signal terminals are independent from each other and do not affect each another even in the structure including the plurality of basic circuits. Therefore, such an operation is allowed that a common control voltage signal is supplied to the first control terminal in one of the basic circuits and to the second control terminal in the other basic circuit for controlling operations of the respective basic circuits. Moreover, each of the preventing members prevents supply of a high frequency signal into the respective control terminals through the signal terminals and other portions of the field-effect transistor, so that a high frequency signal does not flow through paths other than the path between the first and second signal terminals. Thus, combination of such basic circuits can provide a simplified semiconductor integrated circuit including less control terminals and control signals.

In the first semiconductor integrated circuit described above, the gates and the first control terminals may be two or more and equal in number, and the first preventing member may be interposed between each of the gates and the corresponding first control terminal.

The field-effect transistor having the plurality of gates can be functionally equivalent to a structure including a plurality of field-effect transistors having drain/sources connected in series, so that a high frequency voltage applied across the drain/source of each field-effect transistor is substantially divided by the number of gates into a low value. This increases a switchable power and reduces distortion in the output.

The invention also provides a second semiconductor integrated circuit provided with a plurality of basic circuits each being the same as that described above, and further including a first voltage supply terminal connected to the first control terminal in one or some of the basic circuits for supplying a predetermined voltage; and a second voltage supply terminal connected to the second control terminal in the other basic circuit for supplying a voltage having a predetermined potential different from the voltage supplied through the first voltage supply terminal. In one or some of the basic circuits described above, a signal sent to the first control terminal controls the quantity of high frequency signals transmitted between the first and second signal terminals, and, in the other basic circuit, a signal sent to the second control terminal controls the quantity of high frequency signals transmitted between the first and second signal terminals.

According to the above structure, a control voltage signal variable between first and second voltages is supplied to the first or the second control terminal in each of the basic circuits, whereby the quantity of high frequency signals transmitted in each basic circuit is controlled relatively to that in the other basic circuit. Therefore, the control system can be simplified and terminals can be reduced in number even in the structure including a plurality of basic circuits combined together.

The second semiconductor integrated circuit may be provided with the basic circuits which are two in number, and may include an input terminal connected commonly to the first signal terminal of each of the basic circuits; an output terminal connected to the second signal terminal of one of the basic circuits; a ground terminal connected to the second signal terminal of the other basic circuit; and a third control terminal connected commonly to the first control terminal of one of the basic circuits and to the second control terminal of the other basic circuit for inputting a control voltage signal. Each of the basic circuits provides a unit circuit functioning as a switch.

According to the above structure, a control voltage signal supplied through the single third control terminal complementarily control the quantity of high frequency signals transmitted to the output terminal through one of the basic circuits and the quantity of high frequency signals sent to the ground terminal through the other basic circuit. Therefore, combination of the first and second basic circuits can provide a unit circuit which has a simple control system, and can achieve good isolation between the input and the output.

The second semiconductor integrated circuit may be provided with the basic circuits which are two in number, and may include an input terminal connected commonly to the first signal terminal of each of the basic circuits; an output terminal connected to the second signal terminal of one of the basic circuits; a ground terminal connected to the second signal terminal of the other basic circuit; a third control terminal connected commonly to the first control terminal of one of the basic circuits and to the second control terminal of the other basic circuit for inputting a control voltage signal; and two resistors of the same resistance interposed between the source/drain of one of the basic circuits and the first signal terminal of the other basic circuit, respectively. Each of the basic circuits provides a unit circuit functioning as an attenuator.

According to the above structure, the unit circuit forms a bridge T-type attenuator circuit, so that good conditions for matching between the input and the output are maintained, and the quantity of attenuation between the input and the output can be varied with a single control voltage signal. This provides an attenuator having a simplified control system and a good attenuating function for high frequency signals.

The second semiconductor integrated circuit may be provided with the basic circuits which are two in number, and may include an input terminal connected commonly to the first signal terminal of each of the basic circuits; first and second output terminals independently connected to the second signal terminals of the basic circuits, respectively; and a third control terminal commonly connected to the first control terminal of one of the basic circuits and to the second control terminal of the other circuit for supplying a control voltage signal. Each of the basic circuits provides a unit circuit having a signal distributing function for outputting high frequency signals inputted through the common input terminal through the first and second output terminals.

The second semiconductor integrated circuit may be provided with the basic circuits which are two in number, and may include first and second input terminals independently connected to the first signal terminals of the basic circuits, respectively; an output terminal connected commonly to the second signal terminal of each of the basic circuits; and a third control terminal commonly connected to the first control terminal of one of the basic circuits and to the second control terminal of the other circuit for supplying a control voltage signal. Each of the basic circuits provides a unit circuit having a signal mixing function for outputting high frequency signals inputted through the first and second input terminals through the common output terminal.

The second semiconductor integrated circuit may be provided with the basic circuits which are two in number and forming first and second unit circuits, respectively, and may include a third output terminal commonly connected to either of the first output terminals of the unit circuits or the second output terminals of the unit circuits; a fourth output terminal commonly connected to the second or first output terminals of the unit circuits not connected to the third input terminal; and a fourth control terminal commonly connected to the third control terminal of each of the unit circuits. A voltage signal supplied to the fourth control terminal is operable to select alternately the third and fourth output terminals of each of the unit circuits for outputting high frequency signals sent through the input terminal of each of the unit circuits, whereby the first and second unit circuits provides a four-way switch.

The second semiconductor integrated circuit may be provided with a third basic circuit having the same structure as the aforementioned basic circuits and accompanied with at least one of the aforementioned basic circuits. A first signal terminal of the third basic circuit is connected to the input terminal of the unit circuit to which at least one of the basic circuits belongs, and a second signal terminal of the third basic circuit is connected to the ground terminal. When the first control terminal of the basic circuit accompanied with the third basic circuit is connected to the third control terminal, the second control terminal of the third basic circuit is connected to the third control terminal and the first control terminal of the third basic circuit is connected to either of the first or second voltage supply terminal. When the second control terminal of the basic circuit accompanied with the third basic circuit is connected to the third terminal, the first control terminal of the third basic circuit is connected to the third control terminal and the second control terminal of the third basic circuit is connected to either of the first or second voltage supply terminal.

In each of the semiconductor integrated circuits described above, at least one of the basic circuits may be provided with the gates and the first control terminals which are equal in number, and the first preventing member may be interposed between each of the gates and the corresponding first control terminal.

DESCRIPTION OF THE PREFERRED EMBODIMENTS

First Embodiment

Figure 1:
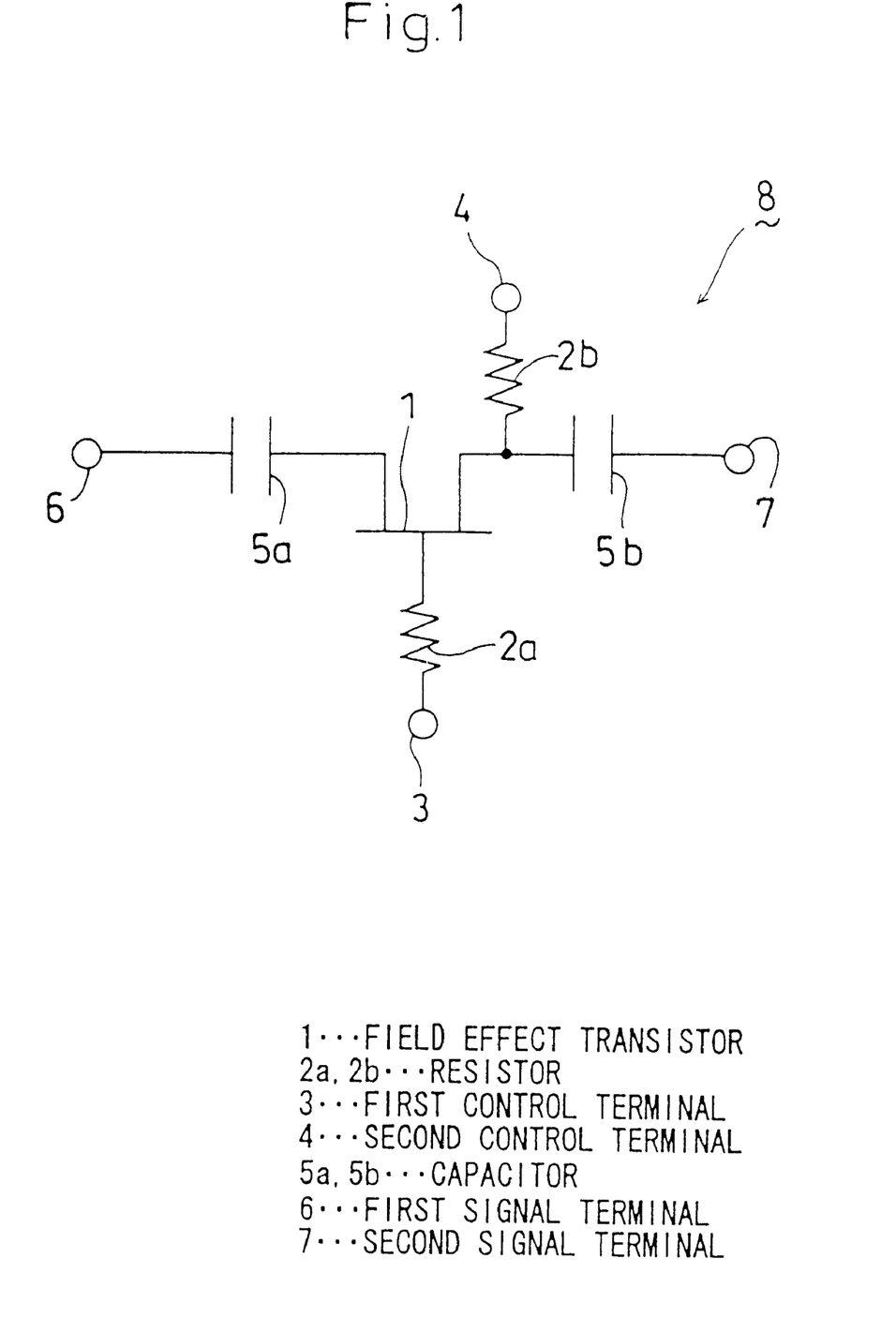
FIG. 1 is a circuit diagram showing a structure of a basic circuit in a high frequency semiconductor integrated circuit of a first embodiment.

A first embodiment will now be described below with reference to FIG. 1. FIG. 1 is a circuit diagram showing a structure of a basic circuit 8 in a semiconductor integrated circuit according to the first embodiment of the invention. The basic circuit 8 includes a field-effect transistor 1 having a gate and source/drain, first and second resistors 2a and 2b provided as first and second preventing members for preventing transmission of high frequency signals, first and second control terminals 3 and 4, first and second capacitors 5a and 5b functioning as members for intercepting a DC component, and first and second signal terminals 6 and 7. The field-effect transistor 1 is of the normally-on type having, for example, a gate length of 1 $\mu$m, a gate width of 1 mm, and a pinch-off voltage of −2V. The gate of the field-effect transistor 1 is connected to the first control terminal 3 via the first resistor 2a. The source is connected to the second control terminal 4 via the second resistor 2b. The resistance values of the resistors 2a and 2b are significantly higher than the line impedance and is equal to 2K$\Omega$. The drain of the field-effect transistor 1 is connected to the first signal terminal 6 via the first capacitor 5a, and the source thereof is also connected to the second signal terminal 7 via the second capacitor 5b. The capacitors 5a and 5b each have a capacitance of 50 pF which is selected for sufficiently reducing a transmission loss in the range from several hundred MHz to several GHz. The capacitors 5a and 5b are formed in such a manner that an insulating film formed of BST (barium titanate-strontium having a dielectric constant of 200 to 300), i.e., a high dielectric material is deposited together with the FET, resistors and others on a common GaAs substrate, and then the deposited structure is patterned. When the BST film is about 200 nm in thickness, the capacitors 5a and 5b each have a capacitance per unit area of 100 pF/100 $\mu m^2$, and the basic circuit 8 shown in FIG. 1 can be formed on the GaAs substrate of about 0.5 mm$^2$. Thus, the area occupied by the basic circuit 8 can be small.

An operation of the semiconductor integrated circuit of this embodiment will now be described below. The resistance between the drain/source of the field-effect transistor 1 varies in accordance with a voltage applied to the gate, which is negative with respect to the source. Thus, the quantity of high frequency signals transmitted between the first and second signal terminals 6 and 7 can be controlled by applying a control voltage signal which sets the first control terminal negative with respect to the second control terminal. The drain/source of the field-effect transistor 1 is direct-currently isolated from the first and second signal terminals 6 and 7 by the capacitors 5a and 5b. Thus, in a high frequency control circuit formed of a plurality of unit circuits, each of which is the same as that of this embodiment, the control voltage signal can be independently applied to the field-effect transistors in each basic circuit without being influenced by the control voltage signal applied to the other basic circuit.

In the basic circuits of the first embodiment and other embodiments to be described later, the field-effect transistors in the basic circuits may be of the normally-off type. In this case, a control voltage signal to be applied is selected to achieve such a relationship that the potential at the first control terminal 3 connected to the gate is higher than that at the second control terminal 4.

In the first embodiment, although the first and second resistors 2a and 2b are arranged as the first and second preventing members for preventing transmission of high frequency signals, the preventing members are not restricted to them. The resistors used in the basic circuits of the first embodiment and the embodiments to be described later may be replaced with members such as a diode having resistance properties.

Although the first and second capacitors 5a and 5b are used as DC component intercepting members in the first embodiment, elements used as the DC component intercepting members are not restricted to the capacitors. For example, since PIN diodes contain a capacitor component, the capacitors 5a and 5b may be replaced with PIN diodes. Even in this case, the DC components can be intercepted, and thus an effect similar to that of the first embodiment can be achieved.

Second Embodiment

Figure 2:
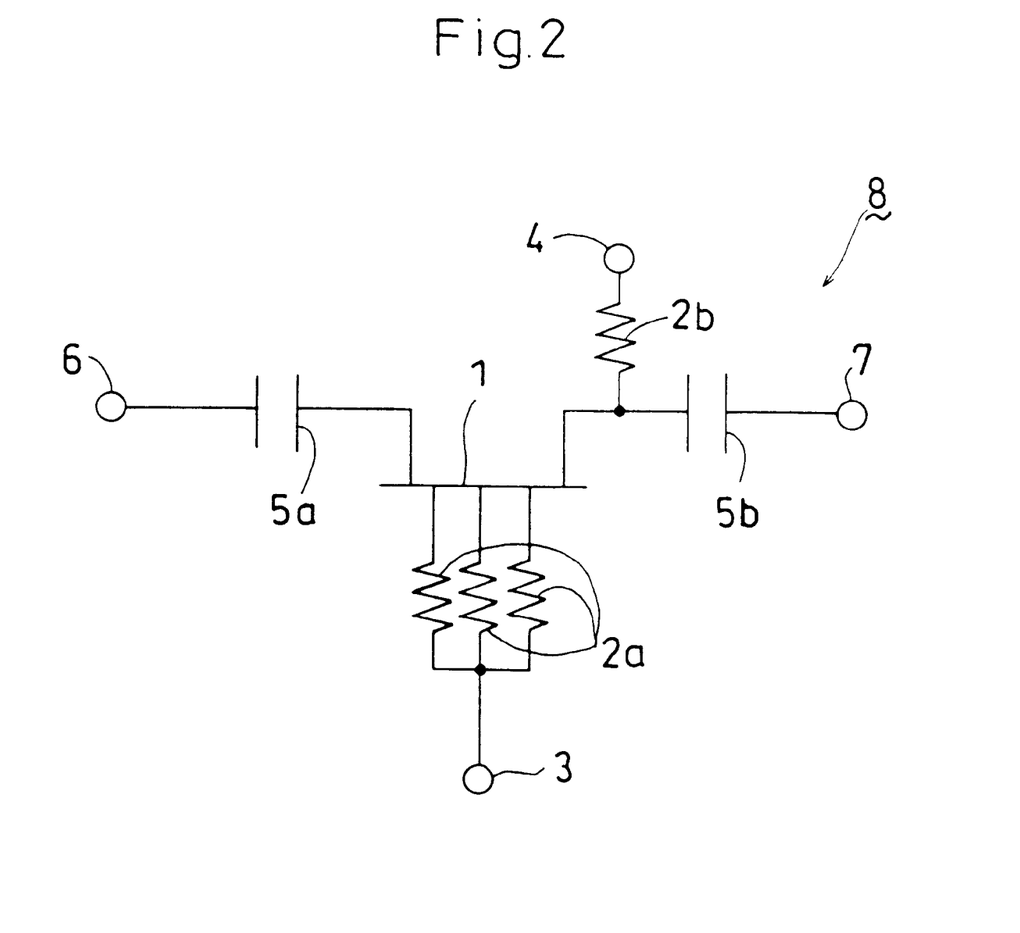
FIG. 2 is a circuit diagram showing a structure of a basic circuit in a high frequency semiconductor integrated circuit of a second embodiment.

A second embodiment will now be described below. FIG. 2 is a circuit diagram showing a structure of a basic circuit in the semiconductor integrated circuit according to the second embodiment. The structure of this embodiment is different from that of the first embodiment only in that the field-effect transistor 1 includes three gate electrodes, and the first resistor 2a is interposed between each gate electrode and the common first control terminal 3. The structure other than the above is the same as that in the first embodiment. The resistance values of the three resistors 2a and the second resistor 2b are sufficiently higher than the line impedance value, and are, e.g., 2KΩ, similarly to the first embodiment. The capacitors 5a and 5b are selected to reduce sufficiently a transmission loss in the range from several hundred MHz to several GHz, and for this purpose, each of them has a capacitance, e.g., 50 pF.

An operation of the semiconductor integrated circuit of this embodiment will now be described below. The operation is basically similar to that of the first embodiment. The quantity of transmitted high frequency signals can be controlled by a negative potential difference of the first control terminal 3 with respect to the second control terminal 4, independently from DC potentials at the first and second signal terminals 6 and 7.

In this embodiment, the field-effect transistor 1 includes the three gate electrodes interposed between the drain and the source. This structure is equivalent to a structure including three field-effect transistors, of which drains and sources are connected in series. Thus, the high frequency voltage applied across the drain/source is substantially divided to one n-th (⅓ in this embodiment), where n is the number of gates. Generally, as the voltage across the drain/source increases, non-linearity in resistance between the drain/source increases. The use of the field-effect transistor having a plurality of gates described above reduces distortion in the output. Furthers each of the gates is connected to the first control terminal 3 via the first resistor 2a. Therefore, the voltage at each gate varies in accordance with a high frequency signal inputted to the signal terminal, and prevents fluctuation of the potential difference between the gate and the source, so that distortion can be further suppressed.

Also in third, sixth and seventh embodiments to be described later, a field-effect transistor in a basic circuit may include a plurality of gates. The gates in all the basic circuits may not have the same structure, and the number of gates in one of the basic circuits may be different from that of the other basic circuit(s).

Third Embodiment

Figure 3:
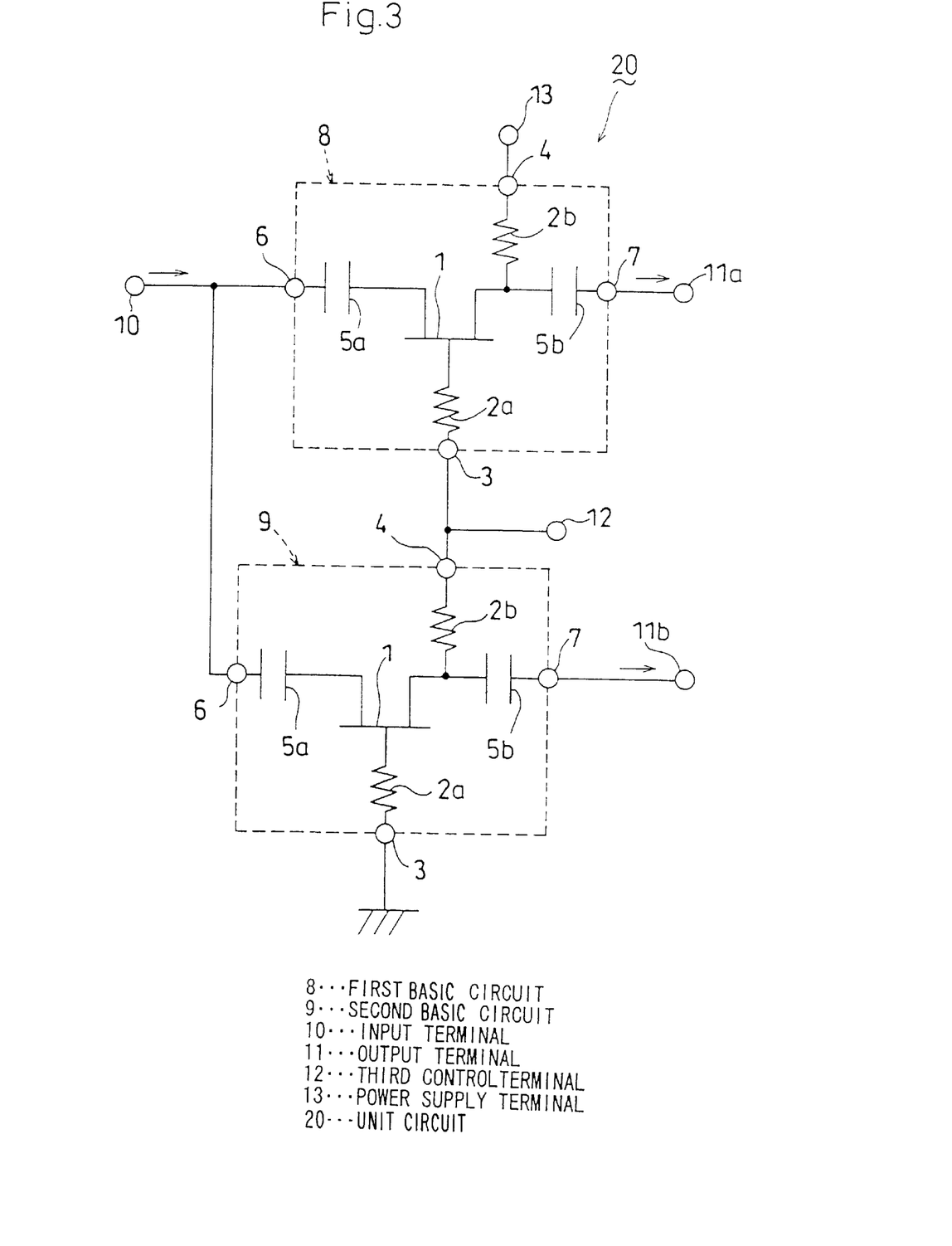
FIG. 3 is a circuit diagram showing a structure of a basic circuit in a high frequency semiconductor integrated circuit of a third embodiment.

A third embodiment will now be described below. FIG. 3 is a circuit diagram showing a structure of a unit circuit 20 in the semiconductor integrated circuit according to the third embodiment. The unit circuit 20 of this embodiment includes two, i.e., first and second basic circuits 8 and 9, each of which has the same structure as that of the unit circuit 8 in the first embodiment. In each of the basic circuits 8 and 9, the first signal terminal 6 is connected to a common input terminal 10. Further, the second signal terminals 7 in the basic circuits 8 and 9 are connected to first and second output terminals 11a and 11b, respectively. Moreover, the first control terminal 3 in the first basic circuit 8 and the second control terminal 4 in the second basic circuit 9 are connected to a common third control terminal 12. The first control terminal 3 in the second basic circuit 9 is connected to the ground terminal, and the second control terminal 4 in the first basic circuit 4 is connected to a power supply terminal 13.

An operation of the semiconductor integrated circuit of this embodiment will be described below. It is assumed that a potential Vdd is set at the power supply terminal 13, a potential Vc is set at the third control terminal 12, a voltage Vgs1 is applied across the gate/source of the field-effect transistor in the first basic circuit 8, and a voltage Vgs2 is applied across the gate/source of the field-effect transistor in the second basic circuit 9. In this case, the following two formulas are obtained:

$$Vgs1 = -Vc,$$

and $$Vgs2 = Vc - Vdd.$$

From the above formulas, the following formula is derived:

$$|Vgs1| + |Vgs2| = Vdd$$

From the above, it is apparent that complementary control voltage signals are applied to the field-effect transistors 1 in the two, i.e., first and second basic circuits 8 and 9, respectively.

In the circuit according to this embodiment, high frequency signals supplied to the input terminal 10 can be distributed to the two output terminals 11a in the first and second basic circuits 8 and 9 with a single control input sent via the third control terminal 12. This is achieved owing to the fact that the first signal inputs of the two basic circuits are connected with respect to a high frequency but are isolated from each other by the capacitors with respect to a direct current. As a result of the above structures a peripheral circuit required for inputting control voltage signals is simplified. The power supply terminal and the ground terminal may be formed of any terminals provided that they can supply two voltages having a predetermined potential difference.

In addition, a plurality of either or both of basic circuits 8 and 9 may be provided.

Fourth Embodiment

Figure 4:
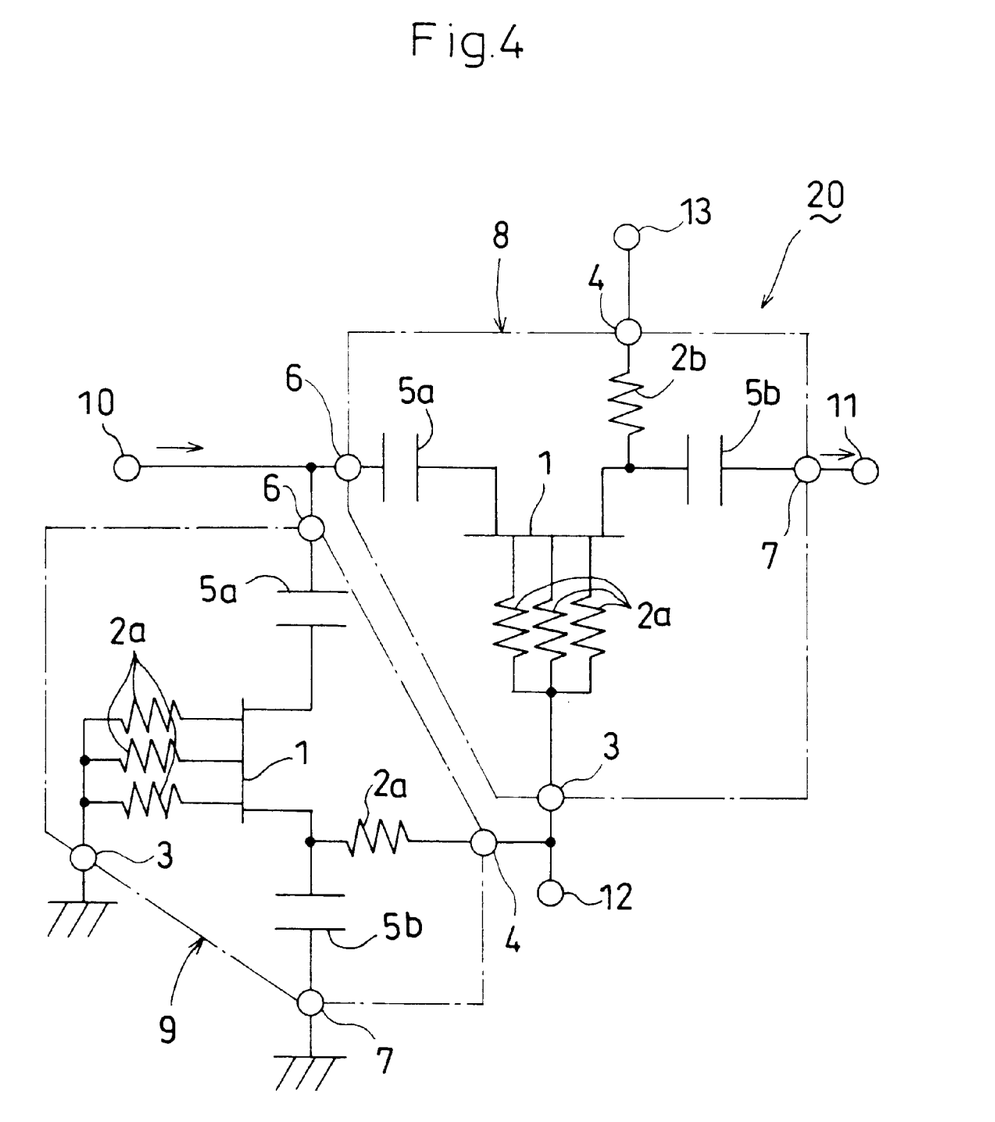
FIG. 4 is a circuit diagram showing a structure of a high frequency distributing circuit of a fourth embodiment.

A fourth embodiment will be described below. FIG. 4 is a circuit diagram showing a structure of the unit circuit 20 in the semiconductor integrated circuit according to the fourth embodiment. The unit circuit 20 in the semiconductor integrated circuit of this embodiment is a switch, in which first and second basic circuits 8 and 9 each having the same structure as that of the basic circuit 8 in the second embodiment are combined, and transmission of high frequency signals between the input terminal 10 and the output terminal 11 is turned on/off with only a control voltage signal applied to the third control terminal 12.

As shown in FIG. 4, the first control terminal 3 and the second signal terminal 7 of the second basic circuit 9 are connected to the ground terminal. The first signal terminal 6 of the second basic circuit 9 is connected to the input terminal 10 to which the first signal terminal 6 of the first basic circuit 8 is also connected. The second control terminal 4 of the second basic circuit 9 is connected to the third control terminal 12 to which the first control terminal 3 of the first basic circuit 8 is also connected. A predetermined voltage is applied via the power supply terminal 13 to the second control terminal 4 of the first basic circuit 8. In this embodiment, the first control terminal 3 of the second basic circuit 9 is connected to the ground terminal. However, this connection is not essential, and this first control terminal 3 may be connected to another voltage supply terminal for supplying a voltage which has a predetermined potential difference relative to the voltage supplied from the power supply terminal 13, i.e., a first voltage supply terminal. The structure of the unit circuit 20 shown in FIG. 4 is merely an example, wherein the second voltage supply terminal is the ground terminal.

According to the above structure, when the input terminal 10 and the output terminal 11 are off with respect to each other, high frequency signals sent via the input terminal 10 can be sent to the ground terminal, which improves isolation between the input and the output.

As described above, the semiconductor integrated circuit of this embodiment can turn on and off the transmission of high frequency signals between the input and the output with a single control voltage signal, so that the peripheral circuit can be simplified. Since the field-effect transistor in this embodiment has three gate electrodes between the drain/source, distortion in the output is suppressed and a switchable power is improved.

Fifth Embodiment

Figure 5:
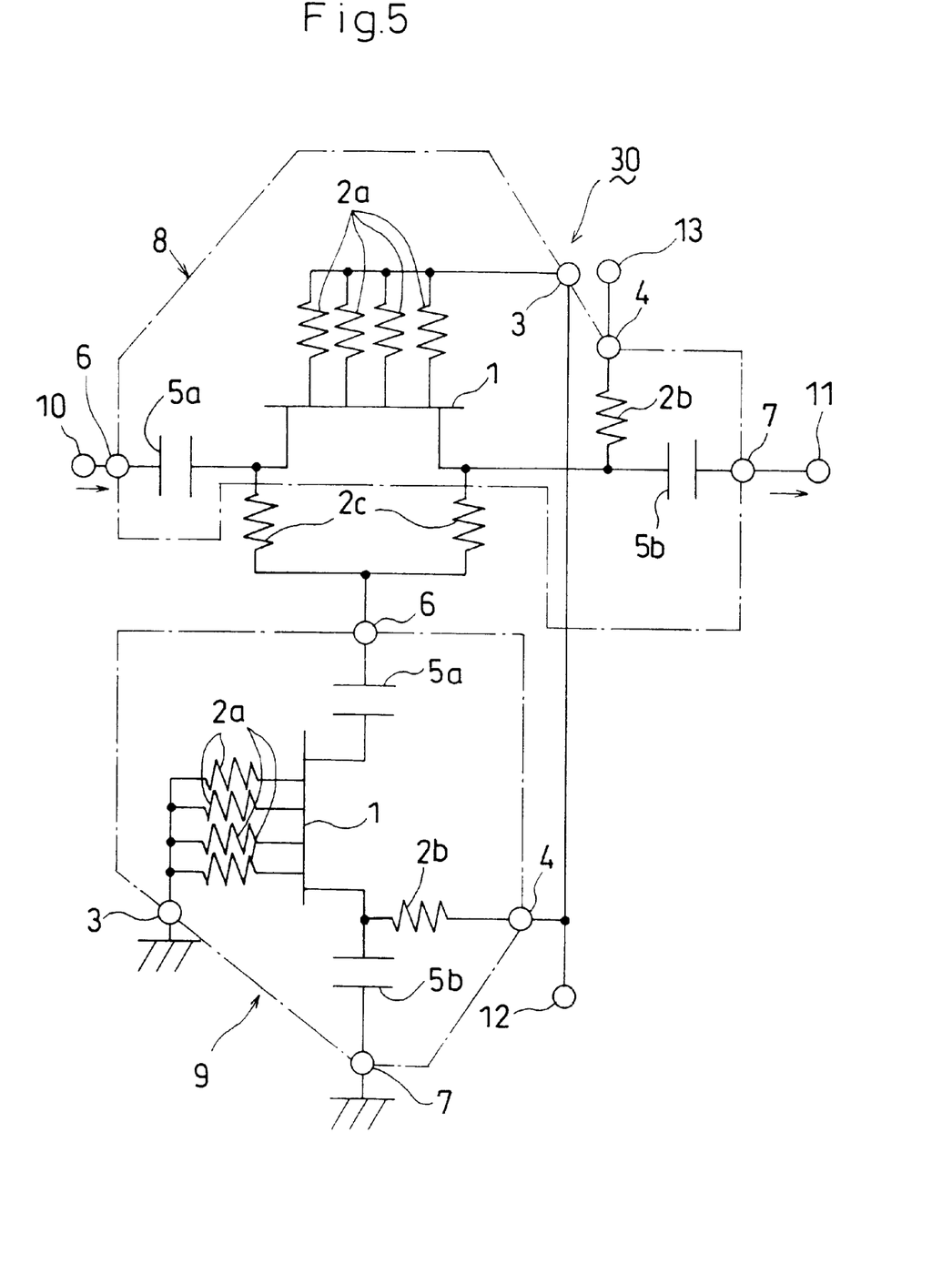
FIG. 5 is a circuit diagram showing a structure of a bridge T-type attenuator circuit of a fifth embodiment.

A fifth embodiment will be described below. FIG. 5 is a circuit diagram showing a structure of a unit circuit 30 in the semiconductor integrated circuit according to the fifth embodiment. In this embodiment, a field-effect transistor is used as a variable resistance which is controlled with a voltage across the gate and the source, and a bridge T-type attenuator circuit is formed.

A basic circuit structure of this embodiment includes the first and second basic circuits 8 and 9, each of which has a structure similar to that of the basic circuit 8 of the second embodiment except for the followings. In this embodiment, four gate electrodes are arranged between the gate and the drain in each of the basic circuits 8 and 9, and these gates are connected to the common power supply terminal 13 or the ground via the four first resistors 2a, respectively. The first signal terminal 6 of the second basic circuit 9 is connected to the source/drain of the first basic circuit 8 of the basic circuit 8 via third resistors 2c having the same resistance. The first control terminal 3 and the second signal terminal 7 of the second basic circuit 9 are connected to the ground terminal. The second control terminal 4 of the second basic circuit 9 and the first control terminal 3 of the first basic circuit 8 are commonly connected to the third control terminal 12. The second control terminal 4 of the first basic circuit 8 is connected to the power supply terminal 13. Although the first control terminal 3 of the second basic circuit 9 is connected to the ground terminal in this embodiment, this connection is not essential, and the first control terminal 3 may be connected to another voltage supply terminal which supplies a voltage having a predetermined potential difference with respect to the voltage supplied from the power supply terminal 13, i.e., a first voltage supply terminal. The structure of the unit circuit 30 shown in FIG. 5 is merely an example, wherein the second voltage supply terminal is the ground terminal. The resistance value of the second resistor 2b is a characteristic impedance value (Zo) of the transmission line in which the basic circuit is interposed, and is generally 50Ω.

In the unit circuit 30 thus constructed, when a voltage in the range from 0V to a value (e.g., 3V) equal to that of the power supply terminal 13 is applied to the third control terminal 12, the resistances Rds between the drain/source of the two field-effect transistors 1 take complementary values. More specifically, when the resistance Rds1 between the drain/source of the field-effect transistor 1 in one of the basic circuits is large, the resistance Rds2 between the drain/source of the field-effect transistor 1 in the other basic circuit is small. When Rds1 is small, Rds2 is large. The matching conditions for the bridge T-type attenuator circuit can be expressed by the following formula:

$$Rds1 \times Rds2 = Zo^2.$$

The above formula is approximately adaptable to the circuit of this embodiment. Therefore, the attenuation between the input and the output can be varied in accordance with a single control voltage signal from the third control terminal 12, while maintaining good matching between the input and the output.

In this embodiment, since each of the field-effect transistors includes the four gate electrodes, this structure is substantially equivalent to a structure including four field-effect transistors, of which drains and sources are connected in series. Therefore, ¼ of the high frequency power supplied through the input is applied across the drain/source of each of the field-effect transistors. The voltage applied between the drain/source is a factor determining characteristics of distortion in the outputs. Thus, a higher voltage across the drain/source generally causes larger distortion. However, the high frequency semiconductor integrated circuit of this embodiment can suppress distortion in the output.

Although the four gate electrodes are arranged between the drain and the source in this embodiment, the switchable power can naturally be increased in accordance with increase of the number (two or more) of gate electrodes.

Sixth Embodiment

A sixth embodiment will be described below with reference to FIG. 6. In this embodiment, the structure of each basic circuit is the same as that of the basic circuit 8 of the first embodiment, and thus each element in each basic circuit shown in FIG. 6 is identified with the same numerals used in FIGS. 1 and 3 to identify each element.

Figure 6:
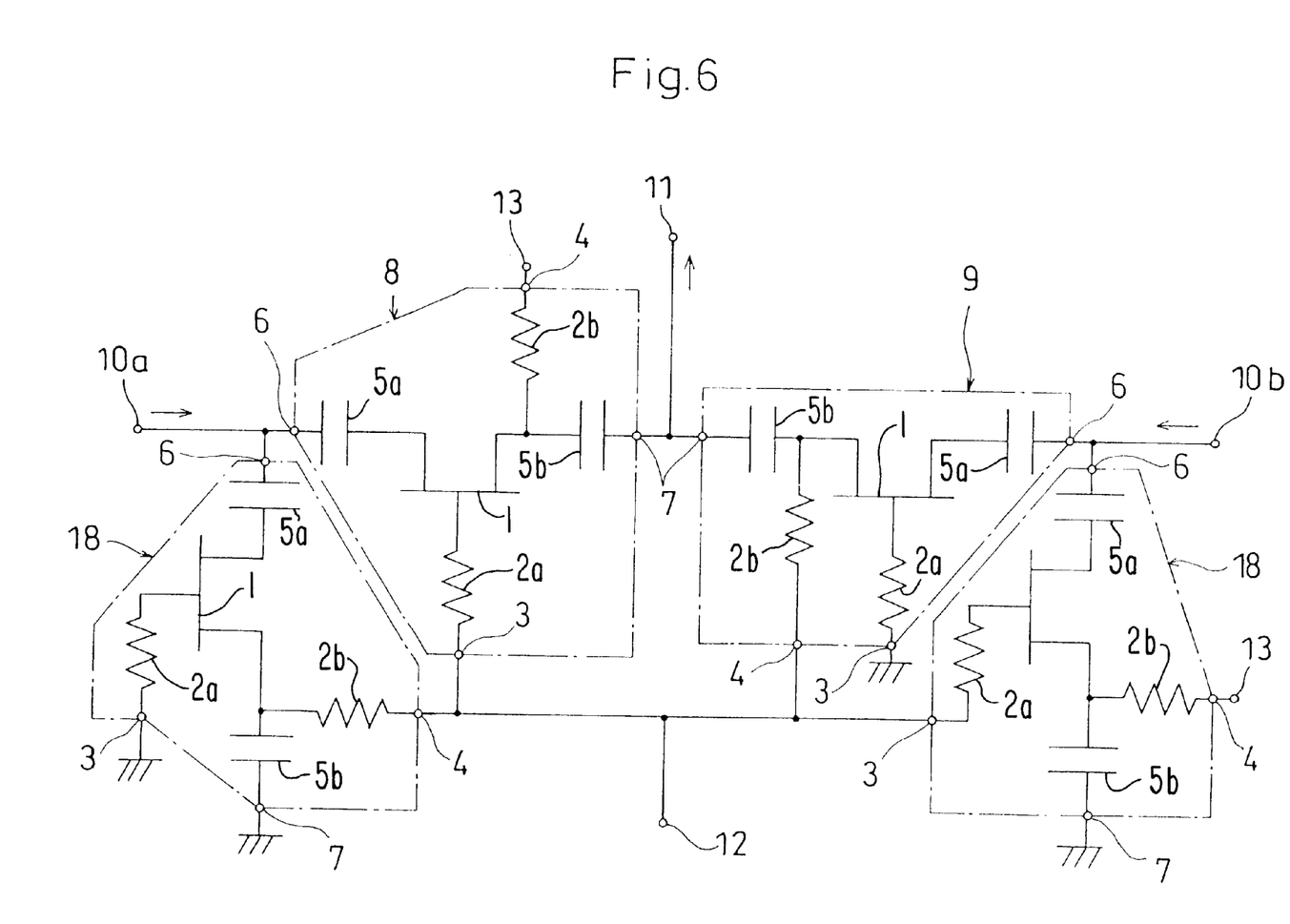
FIG. 6 is a circuit diagram showing a structure of a high frequency mixing circuit of a sixth embodiment.

As shown in FIG. 6, the first signal terminals 6, 6 of the first and second basic circuits 8 and 9 are independently connected to the first and second input terminals 10a and 10b, respectively. The second signal terminals 7, 7 of the first and second basic circuits 8 and 9 are connected to the common output terminal 11. The first control terminal 3 of the first basic circuit 8 and the second control terminal 4 of the second basic circuit 9 are connected the common third control terminal 12. The second control terminal 4 of the first basic circuit 8 is connected to the power supply terminal 13, and the first control terminal 3 of the second basic circuit 9 is connected to the ground terminal.

Each of the basic circuits 8 and 9 is additionally provided with a third basic circuit 18 for sending high frequency signals to the ground terminal when the field-effect transistor is off. In the third basic circuit 18 additionally provided at the first basic circuit 8, a first signal terminal 3 is connected to the first input terminal 10a to which the first signal terminal 6 of the first basic circuit 8 is also connected, a second signal terminal 7 is connected to the ground terminal, a first control terminal 3 is connected to the ground terminal, and a second control terminal 4 is connected to the third control terminal 12 to which the first control terminal 3 of the first basic circuit 8 is also connected. In the third basic circuit 18 additionally provided at the second basic circuit 9, a first signal terminal 6 is connected to the second input terminal 10b to which the first signal terminal 6 of the second basic circuit 9 is also connected, a second signal terminal 7 is connected to the ground terminal, a first control terminal 3 is connected to the third control terminal 12 to which the second control terminal 4 of the second basic circuit 9 is also connected, and a second control terminal 4 is connected to the power supply terminal 13.

In this embodiment, complementary control voltage signals are applied to the field-effect transistors of the basic circuits 8 and 9 via the single third control terminal 12, whereby high frequency signals inputted via the two input terminals 10a and 10b can be outputted from the single output terminal 11 in a mixed form. Thus, the basic circuits 8 and 9 form a unit circuit having a mixing function. Since each of the basic circuits 8 and 9 is additionally provided with the third basic circuit 18, high frequency signals can be sent toward the ground terminal when the field-effect transistor in each of the basic circuits 8 and 9 is off, so that high isolation properties can be achieved.

Although each of the basic circuits 8 and 9 is additionally provided with the third basic circuit 18 in this embodiment, only one of the basic circuits may be provided with the third basic circuit 18.

Although not shown, one, some or all of the basic circuits in the third and fifth embodiments and a seventh embodiment (to be described below) may naturally be additionally provided with a third basic circuit having the same structure as that of the third basic circuit 18 of this embodiment.

The circuit shown in FIG. 6 can also be considered as a combination of two unit circuits, each of which is the same as that already described in connection with the fourth embodiment, although each basic circuit is of a single gate type.

Seventh Embodiment

A seventh embodiment will now be described below with reference to FIG. 7. A circuit of this embodiment is formed of two, i.e., first and second unit circuits 20a and 20b, each having the same structure as that of the unit circuit 20 in the third embodiment (see FIG. 3). Thus, each element in the unit circuits 20a and 20b shown in FIG. 7 is identified with the same numerals used in FIG. 3 to identify each element.

Figure 7:
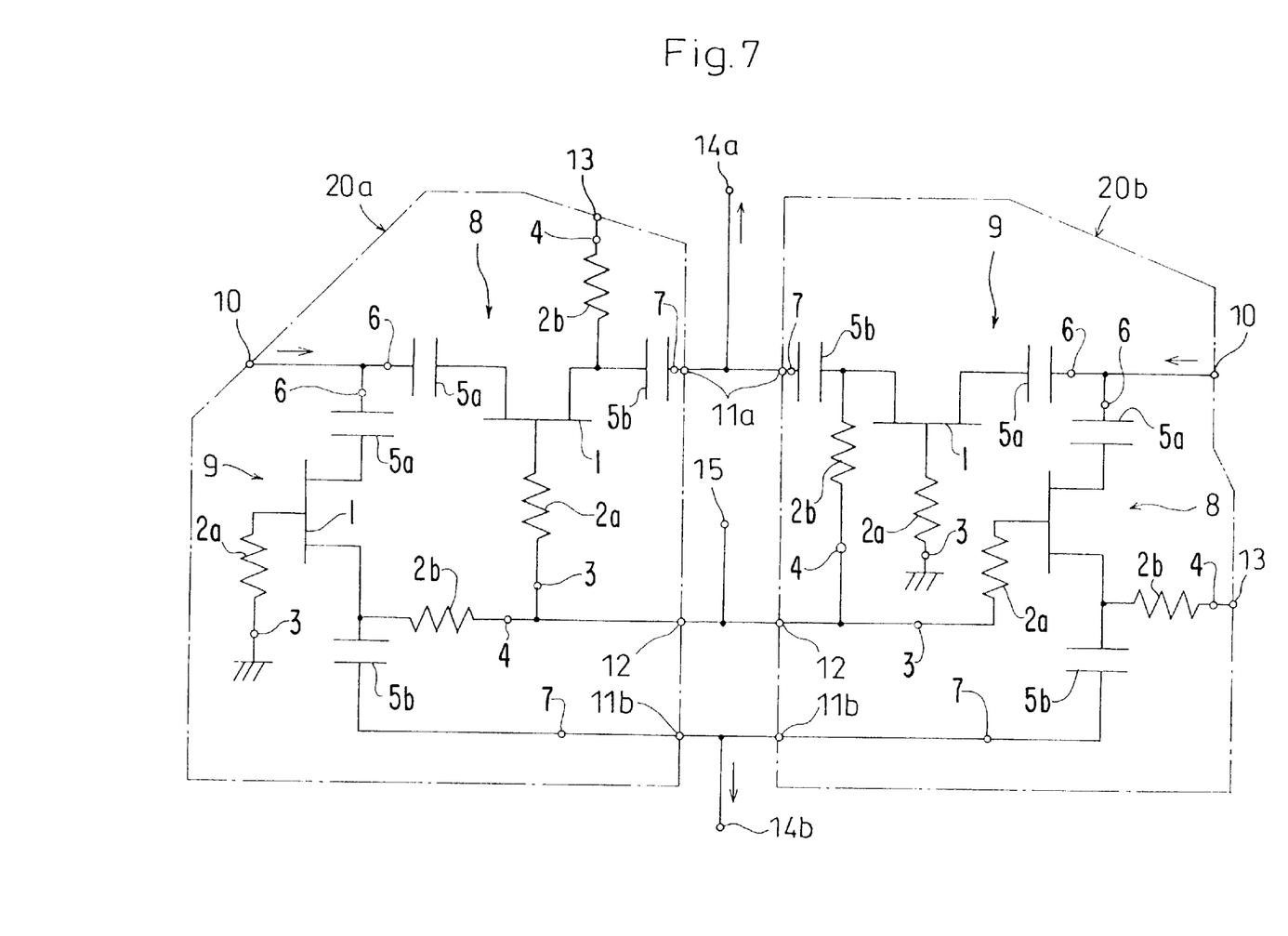
FIG. 7 is a circuit diagram showing a structure of a high frequency four-way switching circuit of a seventh embodiment.

As shown in FIG. 7, one of the output terminals 11a, 11a of both unit circuits 20a, 20b are connected to a common third output terminal 14a. The other output terminals 11b, 11b of both unit circuits 20a, 20b are connected to a common fourth output terminal 14b. The third control terminals 12, 12 of both unit circuits 20a, 20b are connected to a common fourth control terminal 15. The structure of this embodiment can operate in such a manner that high frequency signals sent to both unit circuits can be outputted alternately via the output terminals 14a and 14b in accordance with a control voltage signal supplied to the single fourth control terminal 15. Thus, a combination of the unit circuits 20a and 20b provides a four-way switch circuit.

Eighth Embodiment

Figure 10:
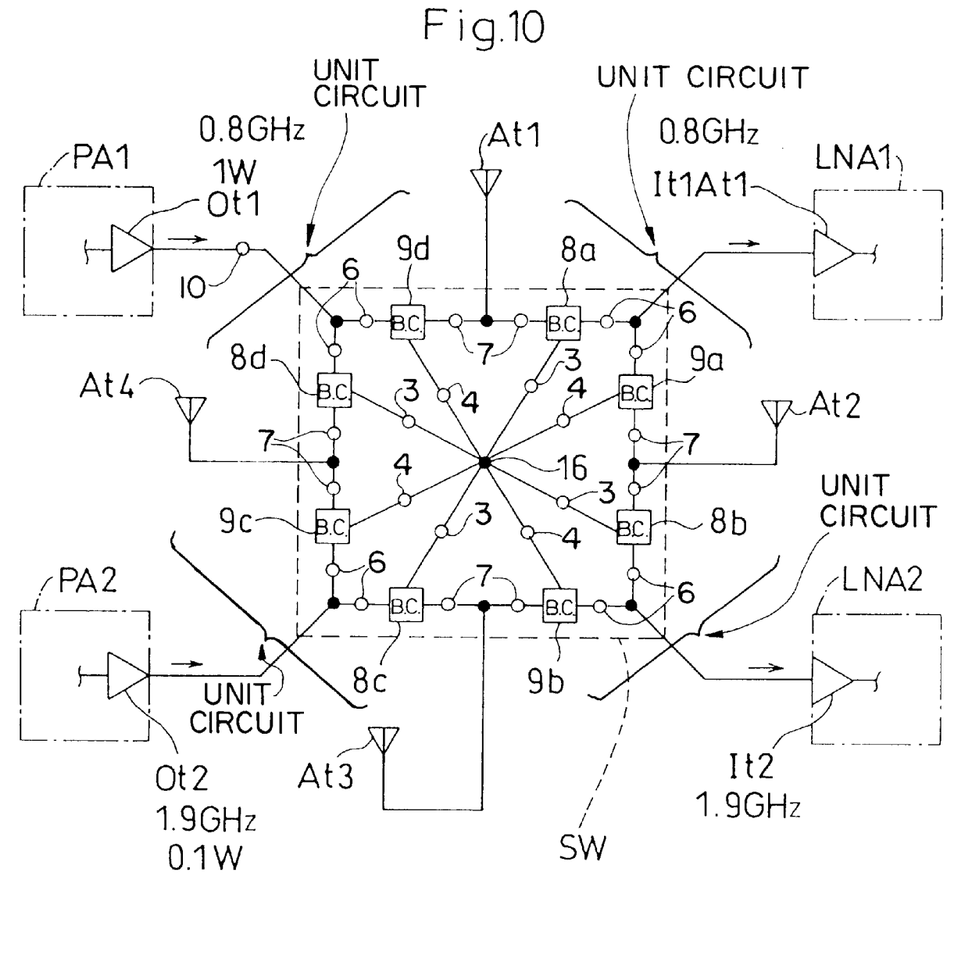
FIG. 10 is a schematic blockdiagram showing a constuction of a ciruict built ina dual-mode portable telephone.

FIG. 10 is a block diagram schematically showing a circuit built in, for example, a dual-mode portable telephone. The basic circuits 8, 9 shown in FIG. 3 are built in the circuit. In detail, four basic circuits 8a–8d and four basic circuits 9a–9d are connected alternately so as to form a closed circuit. The operation of the basic circuits 8a–8d is controlled by a signal to the first control terminal 3. The operation of the basic circuits 9a–9d is controlled by a signal to the second control terminal 4. The source voltage VDD is applied to each second control terminal 4 of the basic circuits 8a–8d and to each first control terminal 3 of the basic circuits 9a–9d through the single control signal terminal 16. Two of first and second power amplifiers PA1, PA2, two of first and second low noise amplifiers LNA1, LNA2 and four antennas At1–At4 are respectively arranged between the basic circuits 8a–8d, 9a–9d, as shown in FIG. 10. Each basic circuit 8a–8d, 9a–9d is switched between ON and OFF in accordance with whether the signal to the single control signal terminal 16 is the source voltage VDD or 0, as indicated in a table below.

TABLE

| control signal | basic circuits | | | | | | | |
|---|---|---|---|---|---|---|---|---|
| | 8a | 9a | 8b | 9b | 8c | 9c | 8d | 9d |
| 0 | OFF | ON | OFF | ON | OFF | ON | OFF | ON |
| VDD | ON | OFF | ON | OFF | ON | OFF | ON | OFF |

Wherein, a transmitter Ot1 of the first power amplifier PA1 is used for 0.8 GHz band and has 1 W output power. A transmitter Ot2 of the second power amplifier PA2 is used for 1.9 GHz band and has 0.1 W output power. A receiver It1 of the first low noise amplifier LNA1 is used for 0.8 HGz band, and a receiver It2 of the second low noise amplifier LNA2 is used for 1.9 GHz band.

The above circuit can be employed as follows.

EXAMPLE 1

The respective antennas At1–At4 are made capable of transmitting or receiving signals so as to have a function of polarization diversity. For instance, the first and third antennas At1, At3 are used for a horizontally polarized plane wave signal, and the second and fourth At2, At4 antennas are used for a vertically polarized plane wave signal. The first antenna At1 is used when the horizontally polarized plane wave signal is transmitted from the first power amplifier PA1, while the fourth antenna At4 is used when the vertically polarized plane wave signal is transmitted therefrom. Transmission from the second power amplifier PA2 and the receipt by each low noise amplifier LNA1, LNA2 are as well.

EXAMPLE 2

Any two of the antennas At1–At4 are made internal antennas and the other two are made external antennas, so that the antennas for transmission and receipt of the respective power amplifiers can be exchanged between inside and outside. For instance, the first and third antennas At1, At3 are used as built-in whip antenna terminals, and the second and fourth antennas At2, At4 are used as external antenna terminals.

What is claimed is:

1. A semiconductor integrated circuit comprising a plurality of basic circuits for transmitting high frequency signals, wherein each of said plurality of basic circuits comprises:

a field-effect transistor having a gate, a source, and a drain, said field-effect transistor being formed on a substrate;

first and second signal terminals for externally transmitting said high frequency signals to and from said field-effect transistor;

DC component intercepting members coupled between said source and drain of said field-effect transistor and said first and second signal terminals, respectively, each of said DC component intercepting members containing at least a capacitor component having an impedance lower than a line impedance in a frequency band to be used;

a first control terminal connected to said gate and formed on said substrate;

a first preventing member coupled between said gate and said first control terminal, having resistance characteristics of an impedance higher than the line impedance;

a second control terminal connected via a branched line to a line between one of said DC component intercepting members and at least one of said source and drain of said field-effect transistor; and a second preventing member formed on said substrate and arranged at said branched line, said second preventing member comprising a resistor having an impedance higher than the line impedance;

wherein a quantity of said high frequency signals transmitted between said first and second signal terminals in said basic circuit under the control of control voltage signals applied to said first and second control terminals, said semiconductor integrated circuit further comprising:

a first voltage supply terminal connected to said second control terminal of a first one of said plurality of basic circuits for supplying a predetermined voltage, a second voltage supply terminal connected to said first control terminal of a second one of said plurality of basic circuits for supplying a voltage having a predetermined potential different from the predetermined voltage supplied via said first voltage supply terminal, and a third control terminal commonly connected to said first control terminal of said first one of said plurality of basic circuits and said second control terminal of said second one of said plurality of said basic circuits, wherein the quantity of said high frequency signals transmitted between said first and second signal terminals of each of said basic circuits is controlled by a control signal sent to said third control terminal.

2. A semiconductor integrated circuit comprising a plurality of basic circuits for transmitting high frequency signals, wherein each of said plurality of basic circuits comprises:

a field-effect transistor having a gate, a source, and a drain, said field-effect transistor being formed on a substrate;

first and second signal terminals for externally transmitting said high frequency signals to and from said field-effect transistor;

DC component intercepting members coupled between said source and drain of said field-effect transistor and said first and second signal terminals, respectively, each of said DC component intercepting members containing at least a capacitor component having an impedance lower than a line impedance in a frequency band to be used;

a first control terminal connected to said gate and formed on said substrate;

a first preventing member coupled between said gate and said first control terminal, having resistance characteristics of an impedance higher than the line impedance;

a second control terminal connected via a branched line to a line between one of said DC component intercepting members and at least one of said source and drain of said field-effect transistor; and a second preventing member formed on said substrate and arranged at said branched line, said second preventing member comprising a resistor having an impedance higher than the line impedance;

wherein a quantity of said high frequency signals transmitted between said first and second signal terminals in said basic circuit under the control of control voltage signals applied to said first and second control terminals, said semiconductor integrated circuit further comprising:

an input terminal connected commonly to said first signal terminal of each of said plurality of basic circuits, an output terminal connected to said second signal terminal of a first one of said plurality of basic circuits, a second voltage supply terminal connected to said second signal terminal of a second one of said plurality of basic circuits, a third control terminal connected commonly to said first control terminal of said first one of said plurality of said basic circuits and to said second control terminal of said second one of said plurality of basic circuits for inputting a control voltage signal, a first voltage supply terminal connected to said second control terminal of said first one of said plurality of basic circuits, and said second voltage supply terminal connected to said first control terminal of said second one of said plurality of basic circuits, wherein each of said plurality of basic circuits is operative as a switch.

3. A semiconductor integrated circuit comprising a plurality of basic circuits for transmitting high frequency signals, wherein each of said plurality of basic circuits comprises:

a field-effect transistor having a gate, a source, and a drain, said field-effect transistor being formed on a substrate;

first and second signal terminals for externally transmitting said high frequency signals to and from said field-effect transistor;

DC component intercepting members coupled between said source and drain of said field-effect transistor and said first and second signal terminals, respectively, each of said DC component intercepting members containing at least a capacitor component having an impedance lower than a line impedance in a frequency band to be used;

a first control terminal connected to said gate and formed on said substrate;

a first preventing member coupled between said gate and said first control terminal, having resistance characteristics of an impedance higher than the line impedance;

a second control terminal connected via a branched line to a line between one of said DC component intercepting members and at least one of said source and drain of said field-effect transistor; and a second preventing member formed on said substrate and arranged at said branched line, said second preventing member comprising a resistor having an impedance higher than the line impedance;

wherein a quantity of said high frequency signals transmitted between said first and second signal terminals in said basic circuit under the control of control voltage signals applied to said first and second control terminals, said semiconductor integrated circuit further comprising:

an output terminal connected to said second signal terminal of a first one of said plurality of basic circuits, a second voltage supply terminal connected to said second signal terminal of a second one of said plurality of basic circuits, a third control terminal connected commonly to said first control terminal of said first one of said plurality of basic circuits and to said second control terminal of said second one of said plurality of basic circuits for inputting a control voltage signal, two resistors of the same resistance interposed between said source and drain, respectively, of said first one of said plurality of basic circuits, said two resistors are commonly coupled to said first signal terminal of said second one of said plurality of basic circuits, a first voltage supply terminal connected to said second control terminal of said first one of said plurality of basic circuits, and said second voltage supply terminal connected to said first control terminal of said second one of said plurality of basic circuits, wherein each of said basic circuits is operative as an attenuator.

4. A semiconductor integrated circuit comprising a first basic circuit and a second basic circuit, each of said basic circuits operative for transmitting high frequency signals, each of said basic circuits comprising:

a field-effect transistor having a gate, a source, and a drain, said field-effect transistor being formed on a substrate;

first and second signal terminals for externally transmitting said high frequency signals to and from said field-effect transistor;

DC component intercepting members coupled between said source and drain of said field-effect transistor and said first and second signal terminals, respectively, each of said DC component intercepting members containing at least a capacitor component having an impedance lower than a line impedance in a frequency band to be used;

a first control terminal connected to said gate and formed on said substrate;

a first preventing member coupled between said gate and said first control terminal, having resistance characteristics of an impedance higher than the line impedance;

a second control terminal connected via a branched line to a line between one of said DC component intercepting members and at least one of said source and drain of said field-effect transistor; and a second preventing member formed on said substrate and arranged at said branched line, said second preventing member comprising a resistor having an impedance higher than the line impedance;

wherein a quantity of said high frequency signals transmitted between said first and second signal terminals in said basic circuit under the control of control voltage signals applied to said first and second control terminals, said integrated circuit device further comprising:

a common input terminal connected to said first signal terminal of each of said basic circuits, a first output terminal connected to the second signal terminal of said first basic circuit, a second output terminal connected to the second signal terminal of said second basic circuit, a third control terminal commonly connected to said first control terminal of said first basic circuit and to said second control terminal of said second basic circuit for supplying a control voltage signal, a first voltage supply terminal connected to said second control terminal of said first basic circuit, and a second voltage supply terminal connected to said first control terminal of said second basic circuit, wherein said first basic circuit and said second basic circuit form a first unit circuit having a signal distributing function for outputting said high frequency signals inputted through said common input terminal through the first and second output terminals.

5. The semiconductor integrated circuit according to claim 4, further comprising:

a second unit circuit having the same structure as said first unit circuit, a third output terminal commonly connected to the first output terminals of said first unit circuit and said second unit circuit, a fourth output terminal commonly connected to the second output terminals of said first unit circuit and said second unit circuit, and a fourth control terminal commonly connected to the third control terminals of said first unit circuit and said second unit circuit, wherein said control voltage signal supplied to said fourth control terminal is operable to select alternatively said third and fourth output terminals of each of said first unit circuit and said second unit circuit for outputting said high frequency signals sent through said input terminal of each of said first unit circuit and said second unit circuit, and said first unit circuit and said second unit circuit providing a four-way switch.

6. A semiconductor integrated circuit comprising a plurality of basic circuits for transmitting high frequency signals, wherein each of said plurality of basic circuits comprises:

a field-effect transistor having a gate, a source, and a drain, said field-effect transistor being formed on a substrate;

first and second signal terminals for externally transmitting said high frequency signals to and from said field-effect transistor;

DC component intercepting members coupled between said source and drain of said field-effect transistor and said first and second signal terminals, respectively, each of said DC component intercepting members containing at least a capacitor component having an impedance lower than a line impedance in a frequency band to be used;

a first control terminal connected to said gate and formed on said substrate;

a first preventing member coupled between said gate and said first control terminal, having resistance characteristics of an impedance higher than the line impedance;

a second control terminal connected via a branched line to a line between one of said DC component intercepting members and at least one of said source and drain of said field-effect transistor; and a second preventing member formed on said substrate and arranged at said branched line, said second preventing member comprising a resistor having an impedance higher than the line impedance;

wherein a quantity of said high frequency signals transmitted between said first and second signal terminals in said basic circuit under the control of control voltage signals applied to said first and second control terminals, a integrated circuit device further comprising:

a first input terminal connected to the first signal terminal of a first one of said plurality of basic circuits, a second input terminal connected to the first signal terminal of a second one of said plurality of basic circuits, an output terminal connected commonly to the second signal terminals of said first one of said plurality of basic circuits and said second one of said plurality of basic circuits, a third control terminal commonly connected to said first control terminal of first one of said plurality of basic circuits and to said second control terminal of said second one of said plurality of basic circuits for supplying said control voltage signal, a first voltage supply terminal connected to said second control terminal of said first one of said plurality of basic circuits, and a second voltage supply terminal connected to said first control terminal of said second one of said plurality of basic circuits, wherein said first one and said second one of said plurality of basic circuits forms a first unit circuit having a signal mixing function for outputting said high frequency signals inputted through the first and second input terminals through said output terminal.

7. The semiconductor integrated circuit according to claim 6, wherein first signal terminals of a third one and a fourth one of said plurality of basic circuits are connected to the first and second input terminals of said first one and said second one of said plurality of basic circuits, respectively, said second signal terminals of said third one and said fourth one of said plurality of basic circuits are connected to the second voltage supply terminal, a second control terminal of said third one of said plurality of basic circuits is connected to said third control terminal, and a first control terminal of said third one of said plurality of basic circuits is connected to said second voltage supply terminal; and a first control terminal of said fourth one of said plurality of basic circuits is connected to said third control terminal, and a second control terminal of said fourth one of said plurality of basic circuit is connected to said first voltage supply terminal.

* * * * *

UNITED STATES PATENT AND TRADEMARK OFFICE
CERTIFICATE OF CORRECTION

PATENT NO.  : 5,903,178
DATED       : May 11, 1999
INVENTOR    : Miyatsuji et al.

It is certified that error appears in the above-identified patent and that said Letter Patent is hereby corrected as shown below:

Column 17

Claim 6, line 33, delete "a" and insert --said--.

Signed and Sealed this

Thirtieth Day of May, 2000

Attest:

Q. TODD DICKINSON

*Attesting Officer*　　　　　*Director of Patents and Trademarks*